United States Patent [19]
Hara

[11] Patent Number: 5,202,655
[45] Date of Patent: Apr. 13, 1993

[54] MICROWAVE ACTIVE FILTER CIRCUIT USING PSEUDO GYRATOR

[75] Inventor: Shinji Hara, Nara, Japan

[73] Assignee: Sharp Kabushiki Kaisha, Osaka, Japan

[21] Appl. No.: 813,995

[22] Filed: Dec. 27, 1991

[30] Foreign Application Priority Data

Dec. 28, 1990 [JP] Japan .................................. 2-408684

[51] Int. Cl.⁵ ........................................... H03H 11/08
[52] U.S. Cl. ...................................... 333/215; 333/216
[58] Field of Search ............................... 333/213–217; 307/490, 520; 330/107

[56] References Cited

U.S. PATENT DOCUMENTS 3,639,858  2/1972  Miyata et al. ................... 333/214 X
3,769,603  10/1973  Herchner ............................ 330/263
3,824,496  7/1974  Hekimian ....................... 330/107 X

FOREIGN PATENT DOCUMENTS 0205107  8/1990  Japan .

OTHER PUBLICATIONS

Pauker, "GaAs Monolithic Microwave Active Gyrator", Ga As IC Symposium 1986 IEEE pp. 82–85.
Chien et al., "Monolithically Integrable Active Microwave Inductor", Electronics Letters, Jul. 7, 1988 vol. 24 No. 14 pp. 905–906.

Primary Examiner—Robert J. Pascal
Assistant Examiner—Seung Ham
Attorney, Agent, or Firm—David G. Conlin; Robert F. O'Connell

[57] ABSTRACT

A low pass filter using two pseudo gyrators 10 and 20 is disclosed. The gate-source capacitances of field effect transistors forming the pseudo gyrator circuit can be considered to be included in capacitors for forming the low pass filter. Therefore, an ideal admittance matrix for a gyrator is obtained. Increase in integration density of the low pass filter can be achieved since the low pass filter is formed by a simplified pseudo gyrator circuit.

7 Claims, 6 Drawing Sheets

MICROWAVE ACTIVE FILTER CIRCUIT USING PSEUDO GYRATOR

BACKGROUND OF THE INVENTION

Field of the Invention

The present invention relates generally to microwave active filter circuits, and more particularly, to a simplified microwave active filter circuit using an active inductor formed by a pseudo gyrator circuit.

Description of the Background Art

In the recent years, electronic equipments comprising monolithic microwave integrated circuits that operate in microwave band have been developed and are available in the market. A filter circuit is generally one of the basic circuit elements which are employed in various microwave integrated circuits.

FIG. 9 is an equivalent circuit diagram of a generally known low pass filter. Referring to FIG. 9, the low pass filter includes two capacitors 71 and 72, and an inductor 70. When such a filter is implemented in a monolithic microwave integrated circuit where miniaturization is an important factor, an MIM capacitor formed of metal—dielectric thin film—metal is used as the capacitive element, with a spiral inductor having a metal strip wound in a planar spiral manner on a dielectric substrate.

FIG. 7A shows a plan structure of a conventional spiral inductor. FIG. 7B shows a sectional structure of the spiral inductor of FIG. 7A taken along line B—B. It can be seen from the figures that the spiral inductor has a metal conductor pattern 81 formed in a planar spiral-like manner on one face of a gallium arsenide substrate 82. Each of the ends 81a and 82b of metal conductor pattern 81 forms the two terminals of the spiral inductor.

FIG. 8 is a circuit block diagram of an inductor using a gyrator. Inductor 65 includes two cascaded gyrator circuits 62 and 64, and a capacitor 63 connected between circuits 62 and 64. It is known that two gyrator circuits 62 and 64 and one capacitor 63 equivalently implement an inductor 65.

Although a conventional spiral inductor shown in FIG. 7A has a simple structure, the configuration thereof has to be increased to obtain the desired inductance. As a result, magnetic field generated by the spiral inductor leaks to deteriorate a peripheral circuit. It is therefore not possible to form other circuits in the periphery of the spiral inductor to prevent increase in integration density of the circuit.

Even in the case where an inductor 65 employing the gyrator of FIG. 8 is used instead of the above-described spiral inductor, increase in the occupying area of integrated circuits formed on a dielectric substrate could not be prevented since the circuit structure of a gyrator circuit was generally complex. Therefore, an active filter implemented using such inductors could not have the occupying area on a dielectric substrate reduced, preventing increase in integration density.

SUMMARY OF THE INVENTION

An object of the present invention is to improve integration density on a dielectric substrate in a microwave integrated circuit including a filter circuit.

Another object of the present invention is to provide a microwave active filter circuit having a simplified circuit structure.

A microwave active filter circuit according to an aspect of the present invention includes cascaded first and second pseudo gyrators, a first capacitor connected between an input node of the first pseudo gyrator and a predetermined reference potential, a second capacitor connected between a common connection node of an output node of the first pseudo gyrator and an input node of the second gyrator and the reference potential, and a third capacitor connected between an output node of the second pseudo gyrator and the reference potential. Each of the first and second pseudo gyrators includes a first inverting amplifier including a first field effect transistor, and a second inverting amplifier coupled to the output of the first inverting amplifier and including a second field effect transistor. The first field effect transistor has the gate coupled to the input node of the corresponding pseudo gyrator, and the source connected to the reference potential. The second field effect transistor has the gate coupled to the drain of the first field effect transistor, the source connected to the reference potential, and the drain coupled to the output node of the corresponding pseudo gyrator. Each of the first and second pseudo gyrators further includes a negative feedback circuit for feeding back negatively the voltage of the output node of the corresponding pseudo gyrator to the input node.

In operation, each of the first and second pseudo gyrators implementing a microwave active filter circuit is formed by a simple circuit. More specifically, each of the first and second pseudo gyrators is formed by cascaded first and second inverting amplifiers and a negative feedback circuit. Accordingly, integration density on the dielectric substrate is increased.

According to another aspect of the present invention, a microwave active filter circuit includes cascaded first and second pseudo gyrators, a first capacitor connected between an input node of the first pseudo gyrator and a predetermined reference potential, a second capacitor connected between a common connection node of an output node of the first pseudo gyrator and an input node of the second pseudo gyrator and the reference potential, and a third capacitor connected between an output node of the second pseudo gyrator and the reference potential. Each of the first and second pseudo gyrators includes cascaded first and second inverting amplifiers, each having an input impedance, a negative feedback circuit for applying negative feedback to the cascaded first and second inverting amplifiers, and a resistor coupled between a common connection node of the first and second inverting amplifiers and the reference potential. The resistance of the resistor is small enough to be substantially negligible in comparison with the input impedance of the first and second inverting amplifiers.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
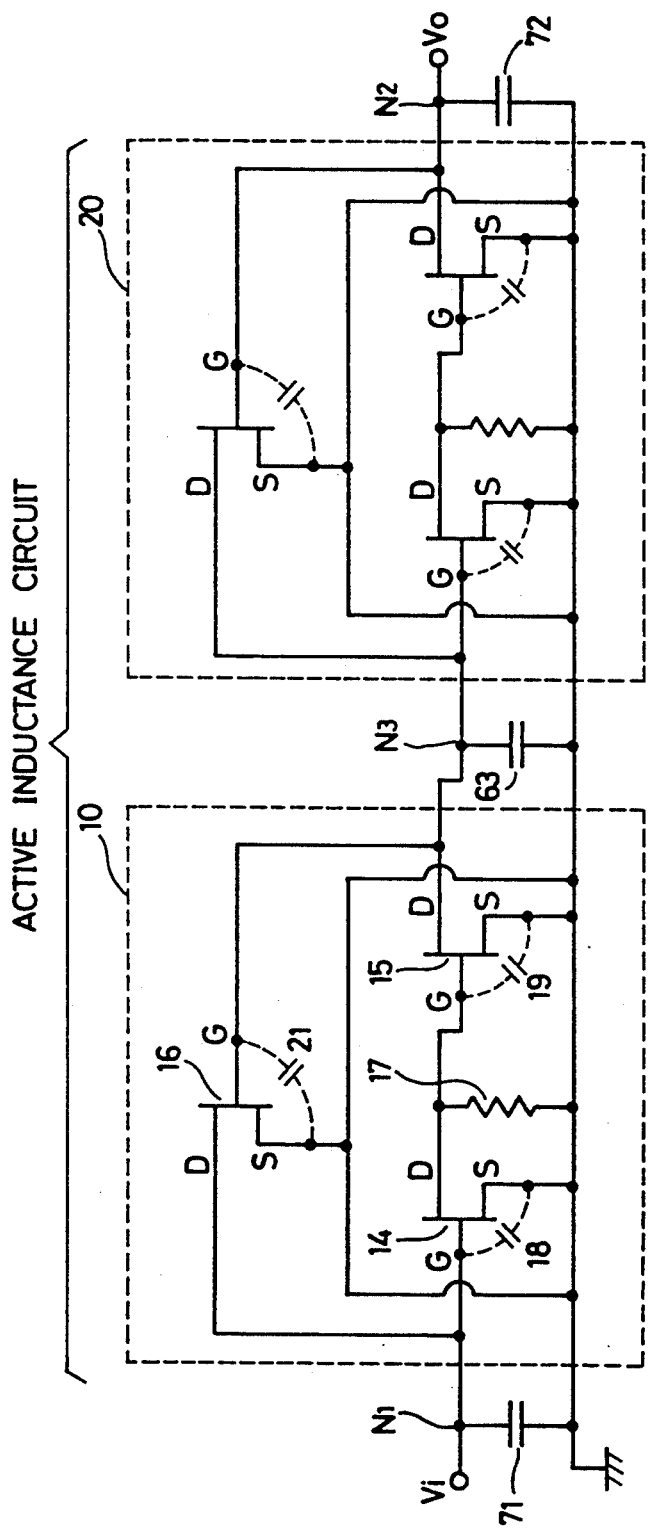
FIG. 1 is an equivalent circuit diagram of a low pass filter showing an embodiment of the present invention.

An ideal field effect transistor is represented by a voltage controlled current source that provides current in proportion to the voltage between the gate and source. The output impedance increases to infinity, and the forward transmission phase difference is 180° in an ideal field effect transistor. Therefore, the admittance matrix of a source grounded field effect transistor is expressed as follows:

$$\begin{bmatrix} 0 & 0 \\ G1 & 0 \end{bmatrix} \quad (1)$$

The admittance matrix of a two-stage field effect transistor connected in a cascade manner is as follows:

$$\begin{bmatrix} 0 & 0 \\ -G2 & 0 \end{bmatrix} \quad (2)$$

G1 and G2 are positive real numbers expressed with mutual conductance of the field effect transistors.

From matrixes (1) and (2), the admittance matrix of the circuit of the present invention which will be described afterwards is as follows:

$$\begin{bmatrix} 0 & G1 \\ -G2 & 0 \end{bmatrix} \quad (3)$$

Admittance matrix (3) means that the circuit thereof operates as a gyrator. An actual circuit formed by a field effect transistor has its high frequency characteristic deteriorated due to the existence of many floating capacitance components. It has been noted that the admittance matrix of (3) is difficult to obtain in the actual circuit. The present embodiment of the invention has this problem solved as will be described hereinafter.

FIG. 1 is an equivalent circuit diagram of a low pass filter showing an embodiment of the present invention. The low pass filter includes an active inductor circuit implemented by two pseudo gyrator circuits 10 and 20, and a capacitor 63. Pseudo gyrator circuits 10 and 20 form a cascade connection via a common connection node N3. Capacitor 63 is connected between node N3 and ground. A capacitor 71 is connected between input node N1 of pseudo gyrator circuit 10 and ground. A capacitor 72 is connected between output node N2 of pseudo gyrator circuit 20 and ground.

Each of pseudo gyrator circuits 10 and 20 has an identical circuit structure. For example, pseudo gyrator circuit 10 includes cascaded field effect transistors 14 and 15, each forming an inverting amplifier, a field effect transistor 16 for negative feedback, and a resistor 17. Transistor 14 has its gate connected to node N1 and its source connected to ground. Transistor 15 has its gate connected to the drain of transistor 14, and its source connected to ground. Transistor 16 has its gate connected to the drain of transistor 15, its drain connected to node N1, and its source connected to ground. It is to be noted that there are gate-source capacitances 18, 19 and 21 between the gates and sources of each of transistors 14, 15 and 16, respectively. Resistor 17 is connected between the common connection node of the drain of transistor 14 and the gate of transistor 15 and ground.

The admittance matrix of pseudo gyrator circuit 10 of FIG. 1 is expressed as below, where gm is the mutual conductance of each transistor, and Cgs is the gate-source capacitance.

$$\begin{bmatrix} j \cdot \omega \cdot Cgsa & gmb \\ -\dfrac{gma^2 \cdot R}{1 + j \cdot \omega \cdot Cgsa \cdot R} & j \cdot \omega \cdot Cgsb \end{bmatrix} \quad (4)$$

Index a designates the values of transistors 14 and 15, and index b designates the value of transistor 16. It is assumed that transistors 14 and 15 have the same value of circuit constant. Therefore, the mutual conductance of transistors 14 and 15 is indicated by gma, and the gate-source capacitance by Cgsa. Also, the mutual conductance of transistor 16 is indicated by gmb, and the gate-source capacitance by Cgsb. Here, $\omega$ indicates angular frequency, and j indicates a purely imaginary number.

It can be appreciated from matrix (4) that pseudo gyrator circuit 10 of FIG. 1 has input admittance $j \cdot \omega \cdot$Ggsa, and output admittance $J \cdot \omega \cdot$Cgsb. This means that capacitances Cgsa and Cgsb are connected to the ends of circuit 10.

Because pseudo gyrator circuit 10 is employed in the low pass filter of FIG. 1, capacitances Cgsa and Cgsb can be considered to be included equivalently in capacitors 71 and 63. Therefore, the following admittance matrix is obtained for pseudo gyrator circuit 10.

$$\begin{bmatrix} 0 & gmb \\ -\dfrac{gma^2 \cdot R}{1 + j \cdot \omega \cdot Cgsa \cdot R} & 0 \end{bmatrix} \quad (5)$$

Assuming that resistance R of resistor 17 is small enough to neglect capacitance Cgsa, all the elements in admittance matrix (5) are real numbers, whereby this circuit 10 serves as a gyrator. This means that pseudo gyrator circuit 10 can be considered as having an ideal admittance matrix for implementing a gyrator. The same thing can be said for pseudo gyrator circuit 20 of the succeeding stage.

Thus, pseudo gyrator circuits 10 and 20 serve as an ideal gyrator to form an ideal active inductor circuit, resulting in a low pass filter having superior characteristics with capacitors 71 and 72. It should also be noted that the simple circuit structure of pseudo gyrator circuit 10 and 20 yields the advantage of increasing integration density of the circuit.

Figure 2:
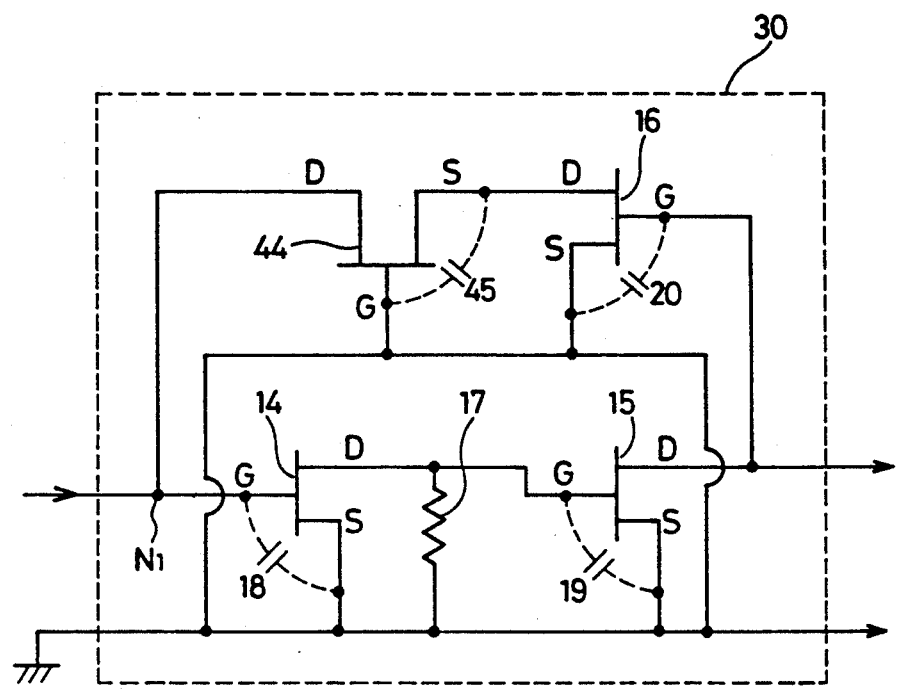
FIG. 2 is an equivalent circuit diagram of a pseudo gyrator circuit applicable to a low pass filter showing another embodiment of the present invention.

FIG. 2 is an equivalent circuit diagram of a pseudo gyrator circuit applicable to a low pass filter showing another embodiment of the present invention. By substituting pseudo gyrator circuit 30 of FIG. 2 for pseudo gyrator circuits 10 and 20 of FIG. 1, a low pass filter can be obtained having filter characteristics more preferable than that of FIG. 1.

Pseudo gyrator circuit 30 of FIG. 2 differs from pseudo gyrator circuit 10 of FIG. 1 in the following points. A field effect transistor 44 is connected between the drain of field effect transistor 16 and input node N1. Transistor 44 has its gate connected to ground, its source connected to the drain of transistor 16, and its source connected to input node N1. Therefore, negative feedback from the drain of transistor 15 to the gate of transistor 14 is realized by a cascaded field effect transistor formed of drain grounded transistor 16 and gate grounded transistor 44. Because pseudo gyrator circuit 30 includes transistor 44 in comparison with one pseudo gyrator circuit 10 of FIG. 1, the input impedance is increased by the function of transistor 44. The admittance matrix of pseudo gyrator circuit 30 of FIG. 2 is expressed as follows:

$$\begin{bmatrix} j\omega C_{gsa} & \frac{gmb^2}{gmb + j\omega C_{gsb}} \\ -\frac{gma^2 R}{1 + j\omega C_{gsa}R} & j\omega C_{gsb} \end{bmatrix} \quad (6)$$

Similar to the case of FIG. 1, the following admittance matrix of pseudo gyrator circuit 30 is obtained:

$$\begin{bmatrix} 0 & \frac{gmb^2}{gmb + j\omega C_{gsb}} \\ \frac{gma^2 R}{1 + j\omega C_{gsa}R} & 0 \end{bmatrix} \quad (7)$$

Assuming that R is a value small enough to neglect Cgs, element $Y_{21}$ of matrix (7) is a real number. Also, if the used frequency f is sufficiently lower than cutoff frequency ft, element $Y_{12}$ is also a real number. Therefore, circuit 30 also serves as a gyrator to form a filter.

Furthermore, if the used frequency f is sufficiently lower than cutoff frequency ft, gain can be applied to the low pass filter since the value of gma·R can be set to a relatively great value.

Figure 4:
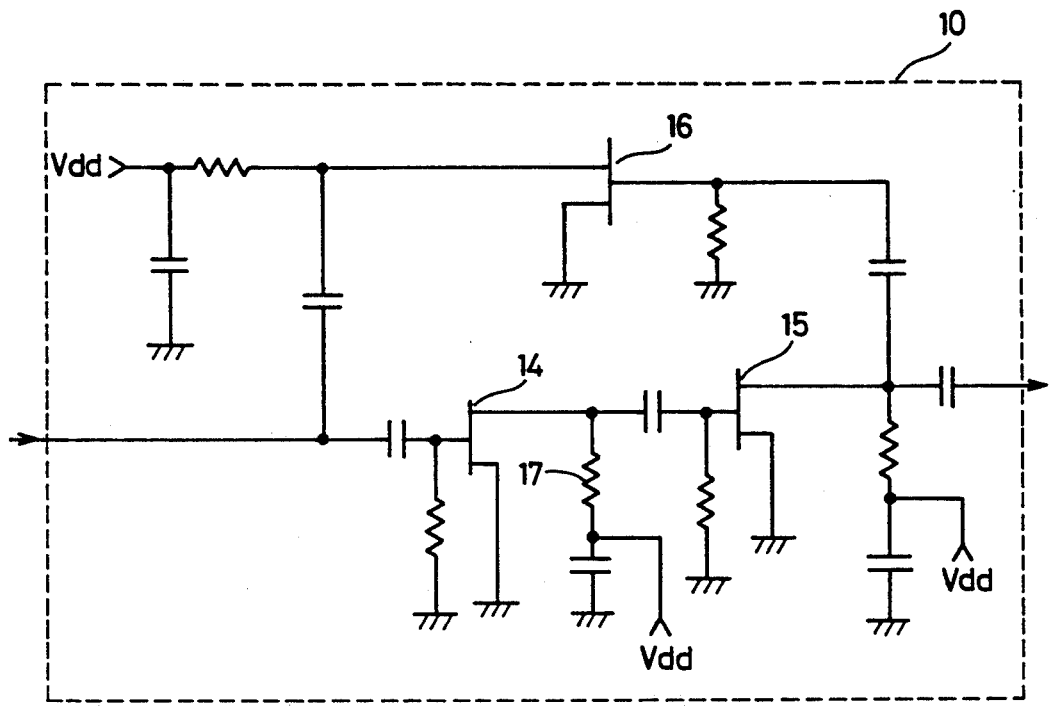
FIG. 4 is a circuit diagram for implementing the pseudo gyrator circuit of FIG. 1.
Figure 5:
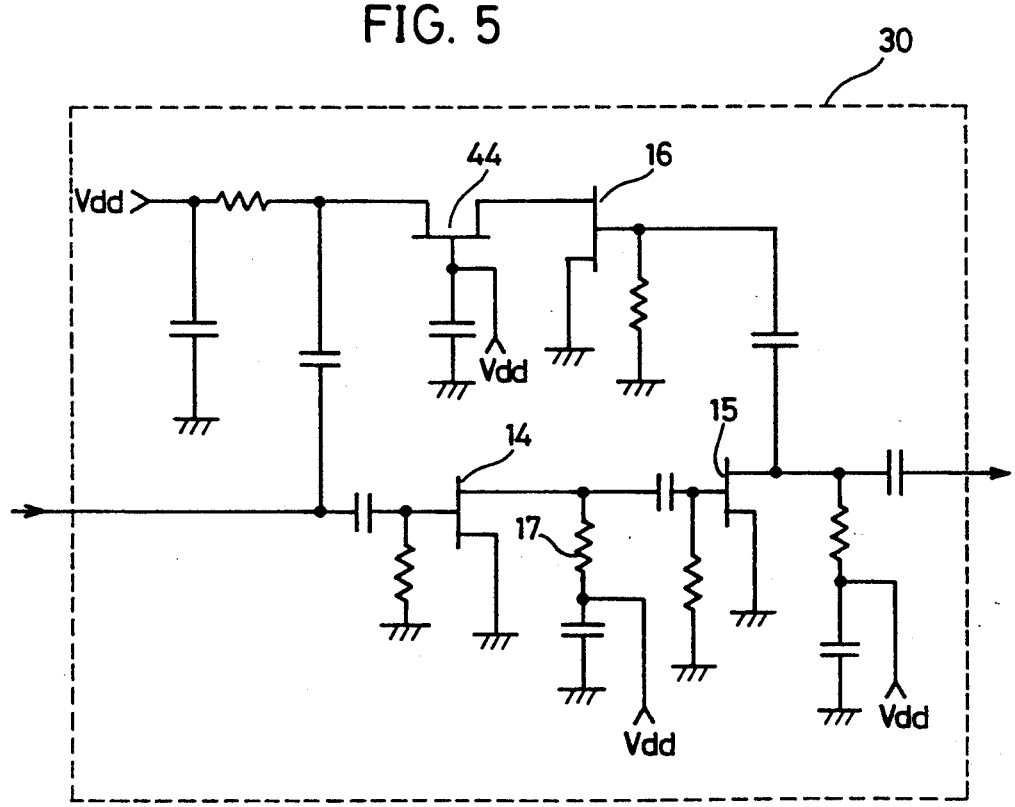
FIG. 5 is a circuit diagram for implementing the pseudo gyrator circuit of FIG. 2.

FIGS. 4 and 5 are actual circuit diagrams of pseudo gyrator circuits 10 and 30 shown in FIGS. 1 and 2, respectively. The pseudo gyrator circuits have the circuit structures for bias and the like shown in FIGS. 4 and 5, in comparison with the equivalent circuits of FIGS. 1 and 2. Vdd indicates power supply potential in FIGS. 4 and 5. It is assumed that the capacitor and the resistor both have sufficient large values.

Figure 6:
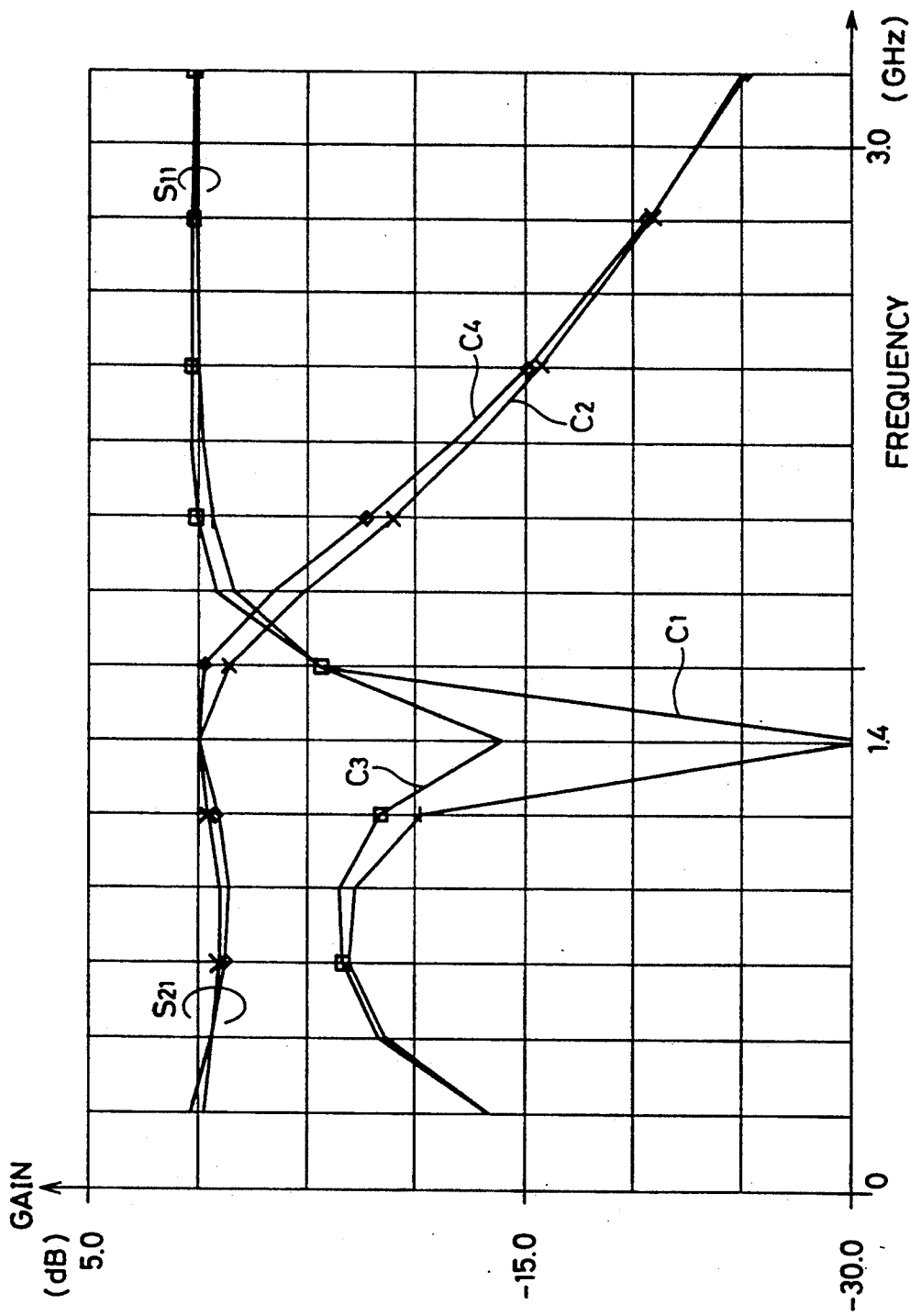
FIG. 6 is a filter characteristic diagram where the pseudo gyrator circuit of FIG. 2 is used to form a low pass filter.
Figure 7B:
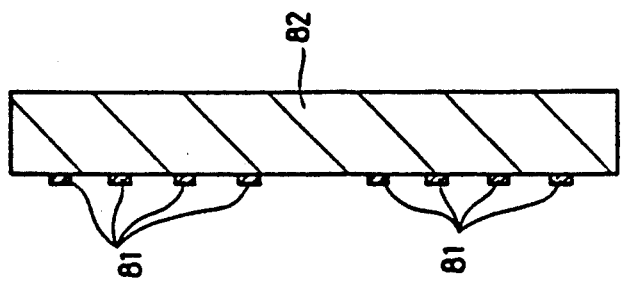
FIGS. 7A and 7B are a plan view and a sectional view, respectively, of a conventional spiral inductor.
Figure 7A:
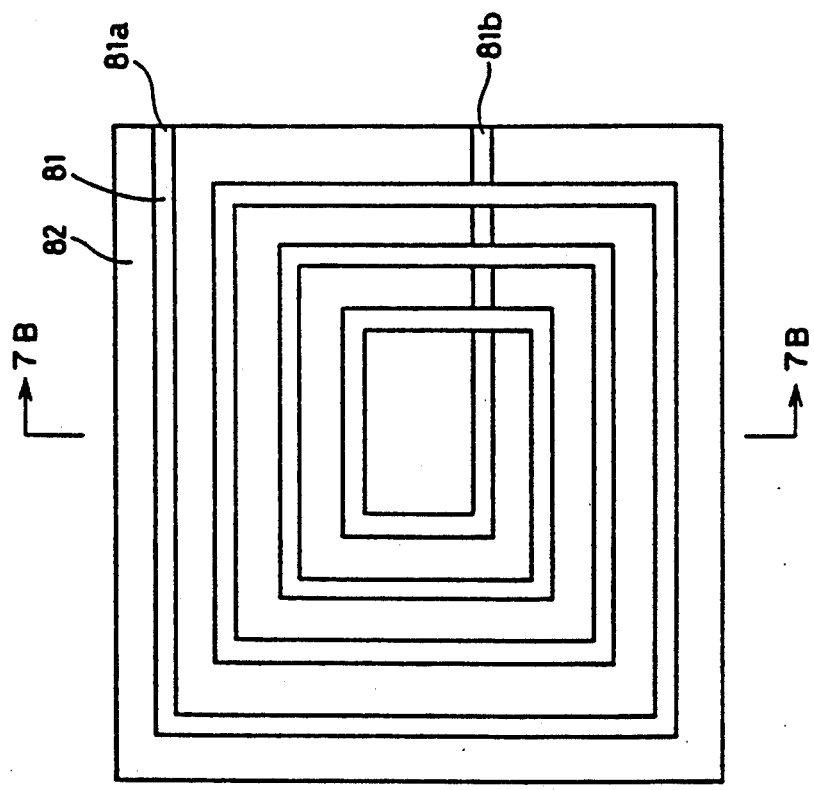
Figure 8:
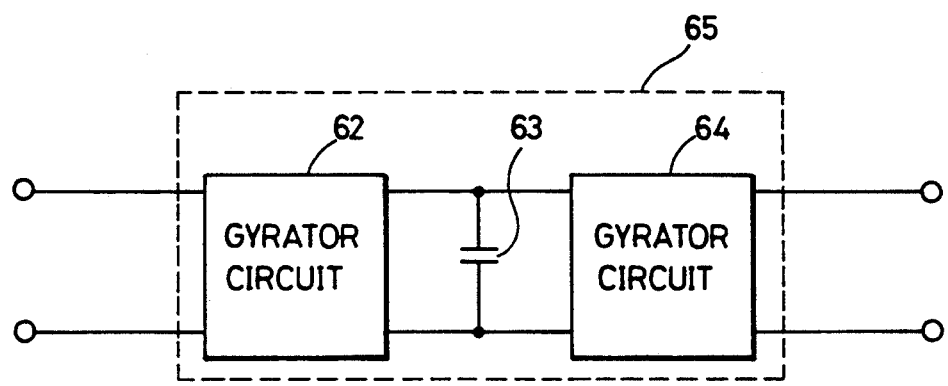
FIG. 8 is a circuit block diagram of an inductor using a gyrator.
Figure 9:
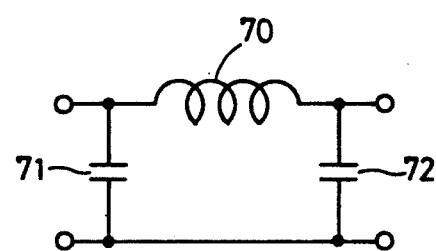
FIG. 9 is a circuit diagram of a generally known low pass filter.

FIG. 6 is a filter characteristic graph where the low pass filter of FIG. 1 is formed using pseudo gyrator circuit 30 of FIG. 2. Referring to FIG. 6, the abscissa indicates frequency (GHz), and the ordinate indicates gain (dB). Curve C1 indicates reflection characteristics ($S_{11}$), and curve C2 indicates transmission characteristic ($S_{21}$) of an ideal filter. Curve C3 indicates reflection characteristic ($S_{11}$), and curve C4 indicates transmission characteristic ($S_{21}$) of the low pass filter using pseudo gyrator circuit 30 of FIG. 2. $S_{11}$ and $S_{21}$ respectively indicate scattering parameters in the scattering matrix showing the filter characteristics. It can be appreciated from FIG. 6 that characteristics approximating those of an ideal low pass filter are obtained.

Figure 3:
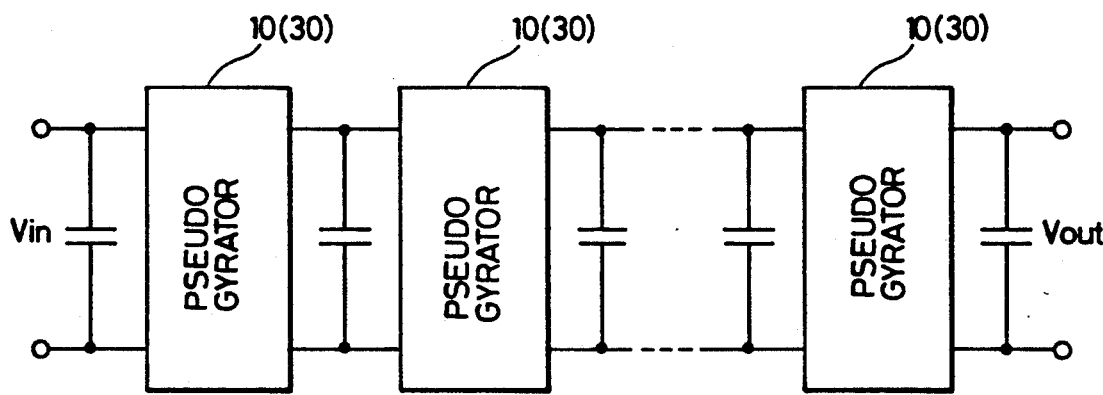
FIG. 3 is a block diagram of a microwave active filter showing a further embodiment of the present invention.

Although the above embodiments were described in which a microwave active filter circuit was implemented using two pseudo gyrator circuits, a desired microwave active filter circuit can be formed by cascading more than two pseudo gyrator circuits 10 (or 30) as that shown in FIG. 3, each having an identical circuit structure.

Since the gate-source capacitance of the field effect transistor included in pseudo gyrator circuits 10, 20 and 30 of FIGS. 1 and 2 can be considered to be included in capacitors 71, 63 and 72 for forming a low pass filter, a low pass filter having preferable characteristics can be obtained. Each of pseudo gyrator circuits 10, 20 and 30 has a simple circuit structure, whereby the occupying area on the circuit is minimized.

It should also be noted that a low loss filter, or a filter having gain can be implemented, since pseudo gyrator circuits 10, 20 and 30 of FIGS. 1 and 2 have amplifying functions.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An active filter circuit comprising:
   cascaded first and second pseudo gyrator means,
   first capacitor means connected between an input node of said first pseudo gyrator means and a predetermined reference potential,
   a second capacitor means connected between a common connection node of an output node of said first pseudo gyrator means and an input node of said second pseudo gyrator means and the reference potential, and
   third capacitor means connected between an output node of the second pseudo gyrator means and the reference potential,
   wherein each of said first and second pseudo gyrator means comprises
   first inverting amplifier means including a first field effect transistor,
   second inverting amplifier means coupled to the output of said first inverting amplifier means, and including a second field effect transistor,
   said first field effect transistor having a gate electrode coupled to the input node of a corresponding pseudo gyrator means, and a source electrode connected to reference potential,
   said second field effect transistor having a gate electrode coupled to a drain electrode of said first field effect transistor, a source electrode connected to the reference potential, and a drain electrode coupled to an output node of said corresponding pseudo gyrator means,
   negative feedback means for feeding back negatively the voltage of the output node of said corresponding pseudo gyrator means to the input node.

2. The active filter circuit according to claim 1, wherein said negative feedback means comprises third inverting amplifier means including a third field effect transistor, said third field effect transistor having a gate electrode coupled to the output node of said corresponding pseudo gyrator means, a drain electrode coupled to the input node of said corresponding pseudo gyrator means, and a source electrode connected to the reference potential.

3. The active filter circuit according to claim 1, wherein said negative feedback means comprises
fourth inverting amplifier means including a fourth field effect transistor, and
impedance increasing means for increasing impedance between the output of said fourth inverting amplifier means and the input node of said corresponding pseudo gyrator means,
said fourth field effect transistor having a gate electrode coupled to the output node of said corresponding pseudo gyrator means, a drain electrode connected to said impedance increasing means, and a source electrode connected to the reference potential.

4. The active filter circuit according to claim 3, wherein said impedance increasing means comprises a fifth field effect transistor,
said fifth field effect transistor having a gate electrode coupled to the reference potential, a source electrode connected to the drain electrode of said fourth field effect transistor, and a drain electrode coupled to the input node of said corresponding pseudo gyrator means.

5. The active filter circuit according to claim 1, wherein each of said first and second pseudo gyrator means further comprises resistor means coupled between the drain electrode of said first field effect transistor and the reference potential, wherein the resistance of said resistor means is small enough to be substantially negligible in comparison with the impedance between the gate electrode and the source electrode of said first and second field effect transistors.

6. The active filter circuit according to claim 1, said active filter circuit comprising a microwave active filter circuit operable in a microwave band.

7. An active filter circuit comprising:
cascaded first and second pseudo gyrator means,
first capacitor means connected between an input node of said first pseudo gyrator means and a predetermined reference potential,
second capacitor means connected between a common connection node of an output node of said first pseudo gyrator means and an input node of said second pseudo gyrator means and the reference potential, and
third capacitor means connected between an output node of said second pseudo gyrator means and the reference potential,
wherein each of said first and second pseudo gyrator means comprises
cascaded first and second inverting amplifier means, each having an input impedance,
negative feedback means for applying negative feedback to said cascaded first and second inverting amplifier means, and
resistor means coupled between a common connection node of said first and second inverting amplifier means and the reference potential,
wherein the resistance of said resistor means is small enough to be substantially negligible in comparison with the input impedance of said first and second inverting amplifier means.

* * * * *